United States Patent
Lin et al.

(10) Patent No.: US 8,059,708 B2
(45) Date of Patent: Nov. 15, 2011

(54) PULSE WIDTH DIGITIZING METHOD AND PULSE WIDTH DIGITIZER USING THEREOF

(75) Inventors: Tsung-Hsin Lin, Taipei (TW); Yao-Hong Liu, Taipei (TW)

(73) Assignee: National Taiwan University, Taipei (TW)

( * ) Notice: Subject to any disclaimer, the term of this patent is extended or adjusted under 35 U.S.C. 154(b) by 223 days.

(21) Appl. No.: 12/633,396

(22) Filed: Dec. 8, 2009

(65) Prior Publication Data

US 2011/0133801 A1    Jun. 9, 2011

(51) Int. Cl.
*H03K 7/08* (2006.01)
*H03K 9/08* (2006.01)

(52) U.S. Cl. ............. 375/238; 375/350; 327/7; 327/172

(58) Field of Classification Search .................. 375/238, 375/350; 332/109, 323; 327/7, 172
See application file for complete search history.

(56) References Cited

U.S. PATENT DOCUMENTS

| | | | |
|---|---|---|---|
| 6,590,426 B2 * | 7/2003 | Perrott | 327/7 |
| 7,432,752 B1 * | 10/2008 | Lee et al. | 327/175 |
| 7,623,600 B2 * | 11/2009 | Momtaz et al. | 375/345 |

* cited by examiner

*Primary Examiner* — Ted Wang
(74) *Attorney, Agent, or Firm* — Rabin & Berdo, PC

(57) ABSTRACT

A pulse width (PW) digitizer comprises a current pump, a capacitor, a quantizer, a feedback controller, and a digital filter. The current pump provides a current signal in response to a PW signal. The capacitor obtains a voltage signal in response to the current signal. The quantizer obtains a digital signal in response to the voltage signal. The feedback controller determines a feedback PW signal in response to the digital signal. The feedback PW signal is fed back to the current pump for controlling the current signal converging to a specific value and controlling the digital signal switching between a first code and a second code. The digital filter counts times that the digital signal indicating the first code/the second code and accordingly obtains the PW of the PW signal.

16 Claims, 6 Drawing Sheets

PULSE WIDTH DIGITIZING METHOD AND PULSE WIDTH DIGITIZER USING THEREOF

BACKGROUND OF THE INVENTION

1. Field of the Invention

The invention relates in general to a pulse width (PW) digitizer, and more particularly to a PW digitizer incorporating delta-sigma modulation.

2. Description of the Related Art

Nowadays, pulse width (PW) signal modulation and detection has been well-known and been applied in a great variety of aspects. Generally, how to detect the PW with fine resolution is a prominent object of the related industry. Conventionally, various methods, such as low-pass filter method and direct-sampling method, exist for PW detection. The low-pass filtering method employs PW signals having the pulse-width information in voltage domain. The PW signal is first averaged by a low pass filter to extract a direct current (DC) voltage. Then the DC voltage is compared by a voltage comparator with a threshold voltage. However, the smoothness of low-pass-filtered pulse signal affects the resolution of pulse-width detection, which can be achieved by extracted over many quench periods, resulting in a trade-off between resolution and conversion speed.

The direct-sampling method, on the other hand, processes the data in time domain. The PW signal is firstly hard limited, and then is directly sampled by a high frequency reference clock to achieve the PW detection. However, the resolution of the pulse-width detection is severely limited by time-domain quantization noise due to insufficient sampling frequency (i.e., quantization jitter) and the quantization jitter due to insufficient sampling frequency is still the dominant resolution limitation in this method.

Thus, how to find a method capable of solving the up-mentioned problems of the known PW signal modulation and detection methods and detecting the PW with fine resolution is a prominent goal for the industries.

SUMMARY OF THE INVENTION

The invention is directed to a pulse width (PW) digitizer, which employs a converter for converting an input PW signal into a current signal and a digitizer for obtaining a digital signal in response to the current signal. The PW digitizer further employs a feedback loop for negatively feedback controlling the current signal converging to specific values and accordingly controlling the digital signal switching between a first code and a second code. The PW digitizer further employs a digital filter for counting times that the digital signal indicating the first code and times that the digital signal indicating the second code, and accordingly obtaining the PW of the PW signal. In other words, the PW digitizer directed by the invention employs delta-sigma configuration to carry out PW detection on the input PW signal. Thus, in comparison to the conventional PW detection, the PW digitizer directed by the invention is advantageously capable of detecting the PW with fine resolution with decent conversion speed and low quantization jitter.

According to a first aspect of the present invention, a pulse width (PW) digitizer system for determining a PW of a PW signal is provided. The PW digitizer system includes a sensor, a current pump, a first capacitor, a quantizer, a feedback controller, and a digital filter. The sensor provides the PW signal. The current pump provides a current signal in response to the PW signal. The first capacitor obtains a voltage signal in response to the current signal. The quantizer obtains a digital signal in response to the voltage signal. The feedback controller determines a feedback PW signal in response to the digital signal, wherein the feedback PW signal is selectively fed back to one of the sensor and the current pump, for respectively controlling the PW signal converging to a specific PW and the current signal converging to a specific value and accordingly controlling the digital signal switching between a first code and a second code. The digital filter counts times that the digital signal indicating the first code and times that the digital signal indicating the second code, and accordingly obtaining the PW of the PW signal.

According to a second aspect of the invention, a PW digitizing method for determining a PW of a PW signal is provided. The PW digitizing method includes the follow steps. Firstly, the PW signal is received at a sensor. Next, a current signal is determined according to the PW signal at a current pump. Then, a voltage signal is determined according to the current signal. Next, a digital signal is determined according to the voltage signal. Then, a feedback PW signal is determined in response to the digital signal, wherein the feedback PW signal is selectively fed back to one of the sensor and the current pump, for respectively controlling the PW signal converging to a specific PW and the current signal converging to a specific value and accordingly controlling the digital signal switching between a first code and a second code. After that, times that the digital signal indicating the first code and times that the digital signal indicating the second code are counted to accordingly obtain the PW of the PW signal.

According to a third aspect of the invention, a PW digitizer for determining a PW of a PW signal is provided. The PW digitizer includes a current pump, a first capacitor, a quantizer, a feedback controller, and a digital filter. The current pump provides a current signal in response to the PW signal. The first capacitor obtains a voltage signal in response to the current signal. The quantizer obtains a digital signal in response to the voltage signal. The feedback controller determines a feedback PW signal in response to the digital signal, wherein the feedback PW signal is fed back to the current pump for controlling the current signal converging to a specific value and accordingly controlling the digital signal switching between a first code and a second code. The digital filter counts times that the digital signal indicating the first code and times that the digital signal indicating the second code, and accordingly obtaining the PW of the PW signal.

The invention will become apparent from the following detailed description of the preferred but non-limiting embodiments. The following description is made with reference to the accompanying drawings.

DETAILED DESCRIPTION OF THE INVENTION

The pulse width (PW) digitizer according to the present embodiment of the invention employs delta-sigma configuration to carry out PW detection.

First Embodiment

Figure 1:
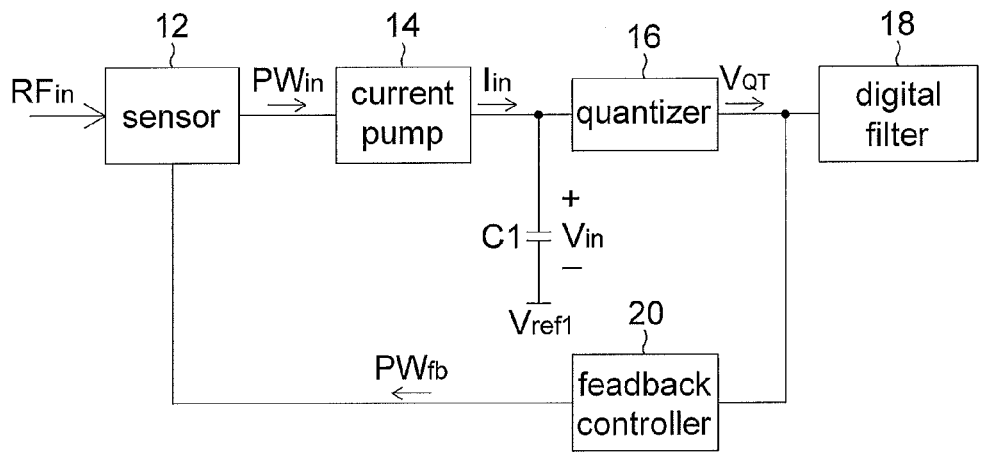
FIG. 1 is a block diagram of the pulse width digitizer system according to a first embodiment of the invention.

Referring to FIG. 1, a block diagram of the pulse width digitizer system according to a first embodiment of the invention is shown. The PW digitizer 1 includes a sensor 12, a current pump 14, a capacitor C1, a quantizer 16, a digital filter 18, and a feedback controller 20.

Figure 2:
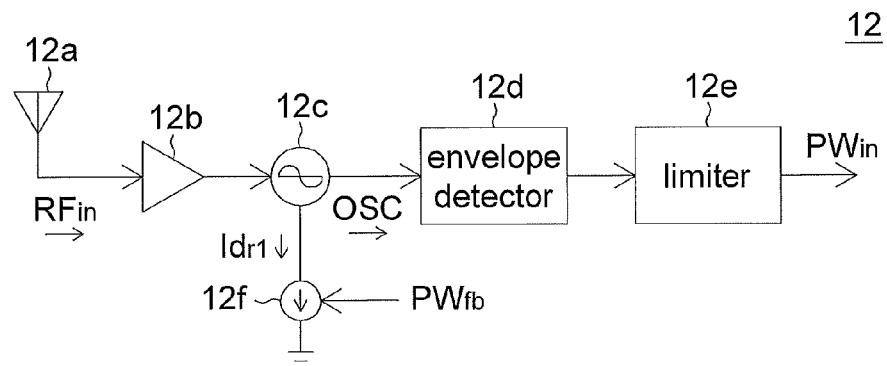
FIG. 2 is a detailed block diagram of the sensor 12 of FIG. 1.

The sensor 12 provides a PW signal $PW_{in}$, the PW of which is about to be measured. Referring to FIG. 2, a detailed block diagram of the sensor 12 of FIG. 1 is shown. For example, the digitizer system 1 is employed in a communication application and the sensor 12 is implemented with a super regenerative receiver for receiving a radio frequency signal and the PW signal $PW_{in}$ is used for indicating the power value of the radio frequency signal. For example, the sensor 12 comprises an antenna 12a, a low noise amplifier 12b, an oscillator 12c, an envelope detector 12d, a limiter 12e, and a current source 12f. The antenna 12a receives a radio frequency signal $RF_{in}$, which is then amplified by the low noise amplifier 12b and provided to the oscillator 12c. For example, the radio frequency signal $RF_{in}$ is an amplitude-shift keying (ASK) signal.

Figure 3:
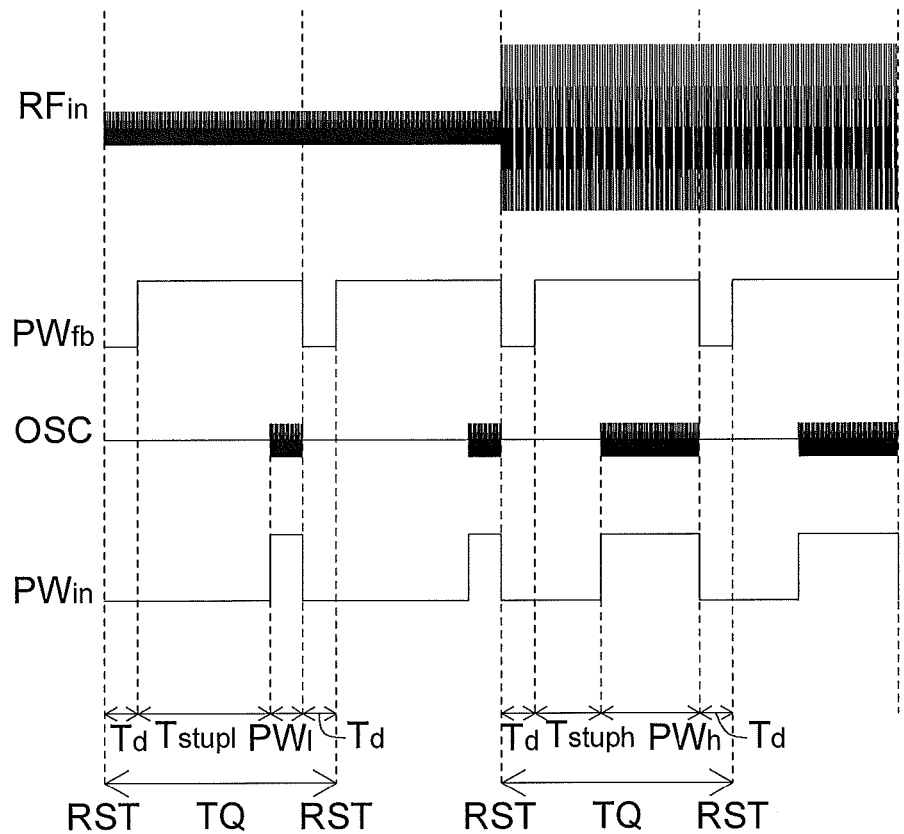
FIG. 3 is a timing diagram of the signals related to the sensor 12 of FIG. 1.

The oscillator 12c is enabled by a driving current $I_{dr}$ provided by the current source 12f for generating an oscillating signal OSC in response to the radio frequency signal $RF_{in}$. The oscillating signal OSC is fed into the envelope detector 12d and limiter 12e to obtain the PW signal $PW_{in}$ by obtaining the envelope of the oscillating signal OSC. In an example, after the driving current $I_{dr}$ is enabled, a startup time is needed for the oscillator 12c to be ready for generating the oscillating signal OSC, wherein the startup time is substantially inversely related to the power of the radio frequency signal $RF_{in}$, as shown in FIG. 3.

When the radio frequency signal $RF_{in}$ corresponds to a low power value, the startup time corresponds to a time period $T_{stupl}$. When the radio frequency signal RFin corresponds to a high power value, the startup time corresponds to a time period $T_{stuph}$. The obtained PW $PW_h$ and $PW_l$ of the PW signal $PW_{in}$ satisfy the condition:

$$PW_l = TQ - Td - T_{stupl}$$

$$PW_h = TQ - Td - T_{stuph}$$

Td is a predetermined reset time; TQ indicating the time length of one operation time period, which is constant and measured between two adjacent reset time spots RST. Thus, by assigning PW signal $PW_{in}$ with a PW corresponding to the startup time, the PW signal $PW_{in}$ capable of indicating the power value of the radio frequency signal $RF_{in}$ can be obtained.

Figure 4:
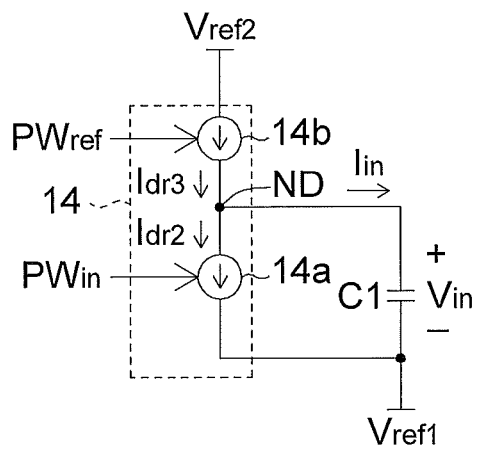
FIG. 4 is a detailed block diagram of the current pump 14 of FIG. 1.

Referring to FIG. 4, a detailed block diagram of the current pump 14 of FIG. 1 is shown. The current pump 14 provides a current signal $I_{in}$ in response to the PW signal $PW_{in}$. For example, the current pump 14 includes current sources 14a and 14b, which are connected to a node ND. The current pump 14 is connected to the capacitor C1 via the node ND. The current source 14a is turned on for providing a driving current $I_{dr2}$ in response to an enable level of the PW signal $PW_{in}$ and turned off in response to a disable level of the PW signal $PW_{in}$.

The current source 14b is turned on for providing a driving current $I_{dr3}$ in response to a reference PW signal $PW_{ref}$ corresponding to a fixed PW. The current signal Iin is determined as the difference between the driving currents $I_{dr2}$ and $I_{dr3}$. The capacitor C1 is charged by the current signal $I_{in}$, for accordingly obtaining a voltage signal $V_{in}$ in response to the current signal $I_{in}$.

In each of the operation time period TQ, the quantizer 16 obtains a digital signal $V_{QT}$ in response to the voltage signal V. For example, the digital signal $V_{QT}$ is a one bit digital signal, which indicates value 1 when the voltage signal $V_{in}$ is greater than a threshold voltage and indicates value 0 when the voltage signal $V_{in}$ is smaller than the threshold voltage.

The feedback controller 20 modulates the feedback PW signal $PW_{fb}$ in response to the digital signal $V_{QT}$. The feedback PW signal $PW_{fb}$ is, for example, fed back to the sensor 12 for controlling the PW signal $PW_{in}$. In an example, by means of modulating the rising edge of the feedback PW signal $PW_{fb}$, the feedback controller 20 achieves the operation of PW subtraction on the PW signal $PW_{in}$ and accordingly achieves PW negative feedback control on the PW signal $PW_{in}$, so as to control the PW signal $PW_{in}$, the current signal $I_{in}$, and the voltage signal $V_{in}$ converging to their specific values and the digital signal $V_{QT}$ switching between a first code and a second code. Thus, the digital filter 18 can determine a PW of the PW signal $PW_{in}$ in response to the digital signal $V_{QT}$ by means of a PW delta-sigma configuration. The just mentioned operations of PW subtraction, PW negative feedback control, and the delta-sigma configuration will be illustrated in more detail in the following paragraphs.

Figure 5A:
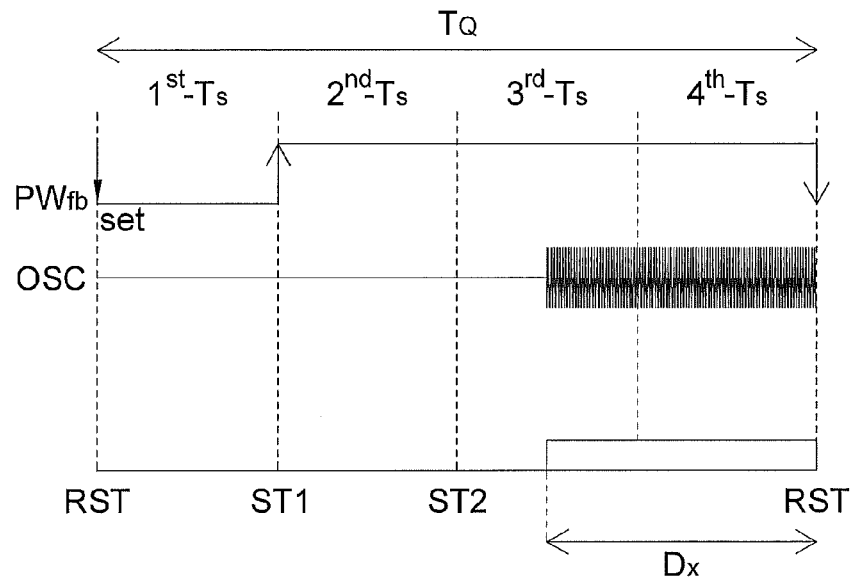
FIGS. 5A and 5B are timing diagrams of the signals related to the sensor 12 of FIG. 1.
Figure 5B:
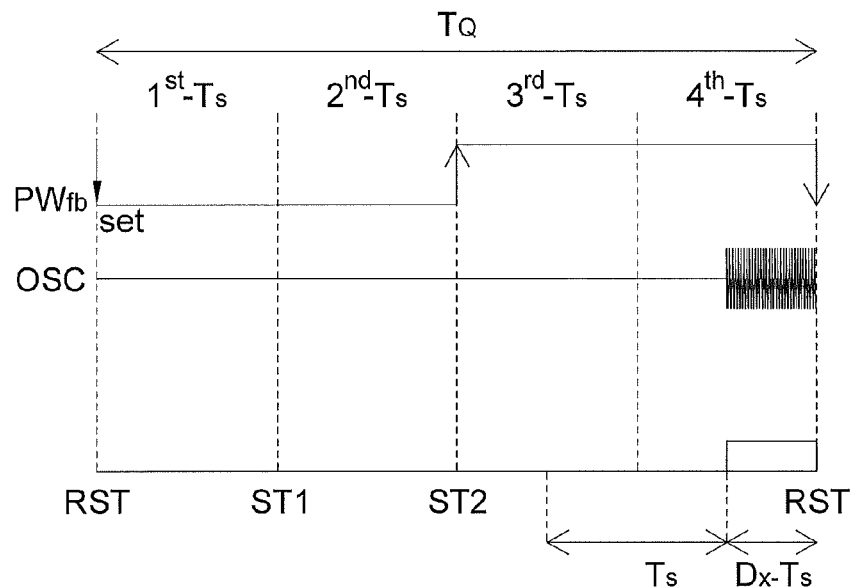

Referring to FIGS. 5A and 5B, timing diagrams of the signals related to the sensor 12 of FIG. 1 are shown. In an example, operation time period TQ is equally divided in to 4 sub time periods $1^{st}$-$T_s$, $2^{nd}$-$T_s$, $3^{rd}$-$T_s$, and $4^{th}$-$T_s$. When the digital signal $V_{QT}$ indicates value 0, the rising edge of the feedback PW signal $PW_{fb}$ is triggered at a time spot ST1, which is at the boundary of the sub time periods $1^{st}$-T, and $2^{nd}$-$T_s$, as shown in FIG. 5A. Under such situation, the PW of the PW signal $PW_{in}D_x$ remains not subtracted.

When the digital signal $V_{QT}$ indicates value 1, the rising edge of the feedback PW signal $PW_{fb}$ is triggered at a time spot ST2, which is at the boundary of the sub time periods $2^{nd}$-$T_s$ and $3^{rd}$-$T_s$, as shown in FIG. 5B. That is to say, in comparison to the operation carries out in the situation: the digital signal $V_{QT}$ indicates value 0, the rising edge of the feedback PW signal $PW_{fb}$ is delayed by a sub time period $T_s$ (i.e. the $2^{nd}$-$T_s$). Therefore, the operation of providing the driving current $I_{dr1}$ (of the current source 12f) and that of generating the oscillating signal OSC (of the oscillator 12c) are delayed by a sub time period $T_s$, so that the PW $D_x$ of the PW signal $PW_{in}$ is accordingly subtracted and reduced by a sub time period $T_s$. Thus, the sensor 12 can be controlled by the feedback controller 20 to modulate the PW signal $PW_{in}$ corresponding to its original value $D_x$ or corresponding to the value $D_x$-$T_s$.

Figure 6:
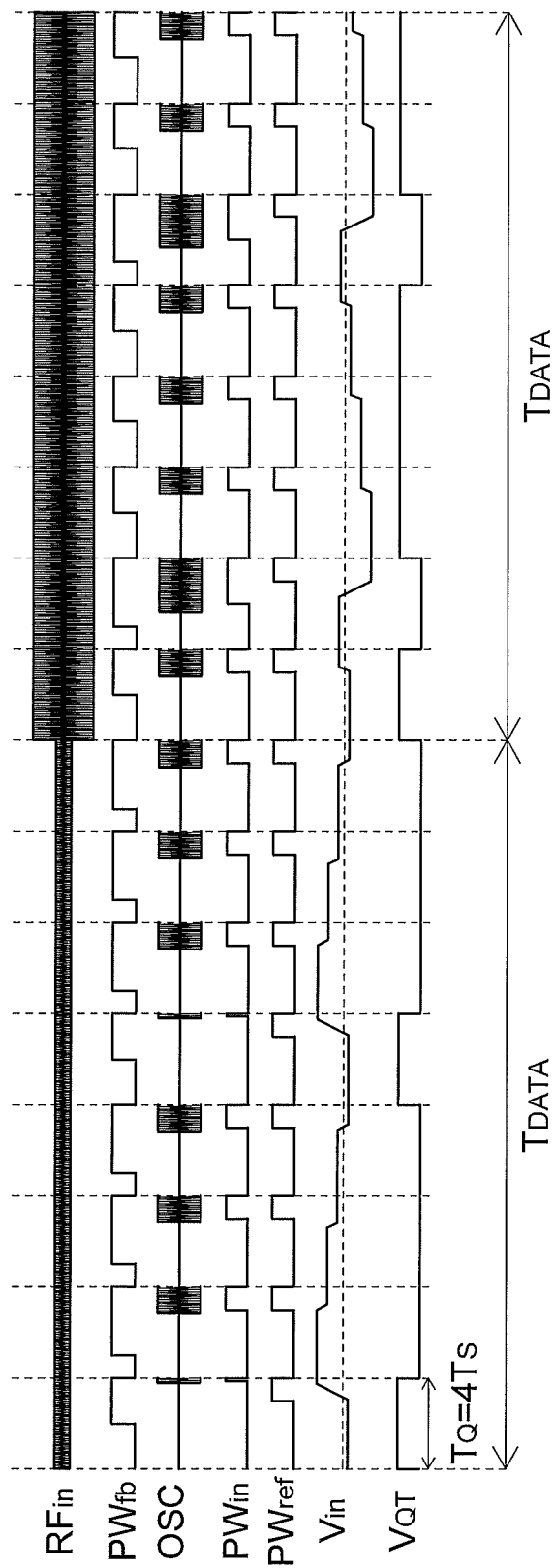
FIG. 6 is a timing diagram of the related signals in FIGS. 1-3.

Referring to FIG. 6, a timing diagram of the related signals in FIGS. 1-3 is shown. By means of carrying out the PW subtraction, negative feedback control can be applied on the PW signal $PW_{in}$, so as to control the PW signal $PW_{in}$ converging to a specific PW value. For example, the specific PW value is constant and equal to one sub time period $T_s$. Since the PW signal $PW_{in}$ converges to the specific PW value, the current signal $I_{in}$ and the voltage signal $V_{in}$ generated accordingly will converge to their specific values. In an example, by setting the reference PW signal $PW_{ref}$ to be one sub time period $T_s$, the current sources 14a and 14b are controlled by PW signals with substantially the same PW to accordingly provide substantially the same driving currents $I_{dr2}$ and $I_{dr3}$, i.e. the current signal $I_{in}$ and the voltage signal $V_{in}$ converge to zero current value and zero voltage value, respectively.

As described in the above mentioned paragraphs, a negative feedback loop is established among the sensor 12, the current pump 14, the quantizer 16, and the feedback controller 20. Thus, it can be obtained that the digital signal $V_{QT}$ keeps switching between codes 1 and value 0. The digital filter 18 counts times that the digital signal $V_{QT}$ indicating the code 1 and times that the digital signal $V_{QT}$ indicating the code 0 within an over-sampling period $T_{DATA}$ to accordingly obtain the PW of the PW signal $PW_{in}$. The over-sampling period $T_{DATA}$ is, for example, corresponding to 8 $T_Q$, as illustrated in FIG. 6. Thus, the delta-sigma modulation can be carried out to obtain the PW of the PW signal $PW_{in}$ and the power of the radio frequency signal $RF_{in}$.

Though only the situation that the digitizer system 1 is employed in a communication application with a super regenerative receiver is cited as an example in the present embodiment, the digitizer system 1 is not limited thereto, and can be employed in other situations.

Though only the situation that the sensor 12 is a super regenerative sensor is cited as an example illustrated in the present embodiment of the invention, the sensor 12 is not limited thereto, and can be implemented as other kinds of sensors with PW signal output.

The PW digitizer system according to the present embodiment of the invention employs a converter for converting an input PW signal into a current signal and a quantizer for obtaining a digital signal in response to the current signal; a feedback loop for negatively feedback controlling the input PW signal converging to specific values and accordingly controlling the digital signal switching between a first code and a second code; and a digital filter for counting times that the digital signal indicating the first code and times that the digital signal indicating the second code, and accordingly obtaining the PW of the PW signal. Thus, the PW digitizer system according to the present embodiment of the invention carries out PW detection on the input PW signal by employing a delta-sigma configuration. Thus, in comparison to the conventional PW detection, the PW digitizer system directed by the invention is advantageously capable of detecting the PW with fine resolution with decent conversion speed and low quantization jitter.

Second Embodiment

Figure 7:
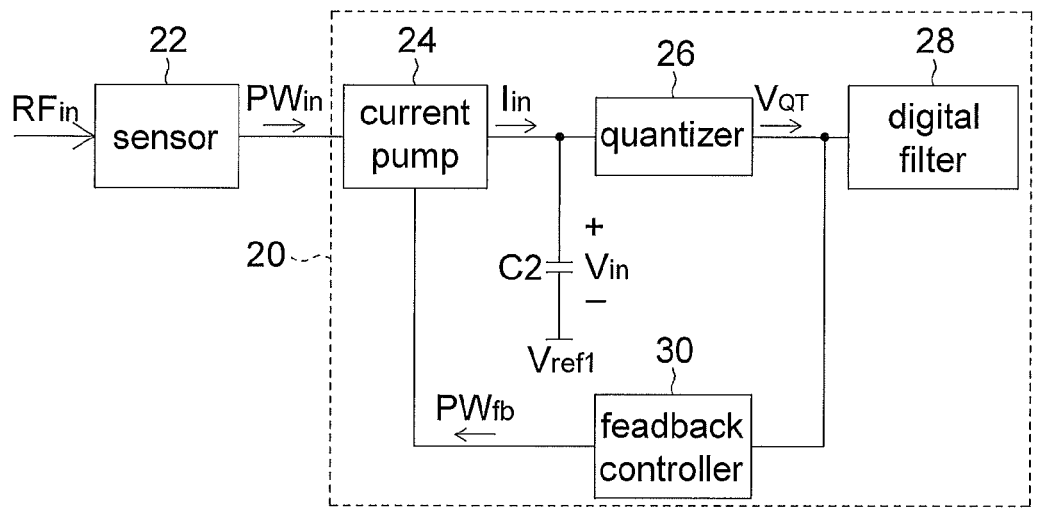
FIG. 7 is a block diagram of the pulse width digitizer system according to a second embodiment of the invention.

The PW digitizer system according to the second embodiment of the invention employs different feedback circuit path for carrying out feedback control. Referring to FIG. 7, a block diagram of the pulse width digitizer system according to a second embodiment of the invention is shown. The PW digitizer system 2 is different from the PW digitizer according to the first embodiment of the invention in that the feedback PW signal $PW_{fb}$ is fed back to the current pump 24 rather than the sensor 22. In this embodiment, the current pump 24, the quantizer 26, the digital filter, and the feed back controller 30 form a PW digitizer 20 for carrying out PW-to-digital conversion.

Figure 8:
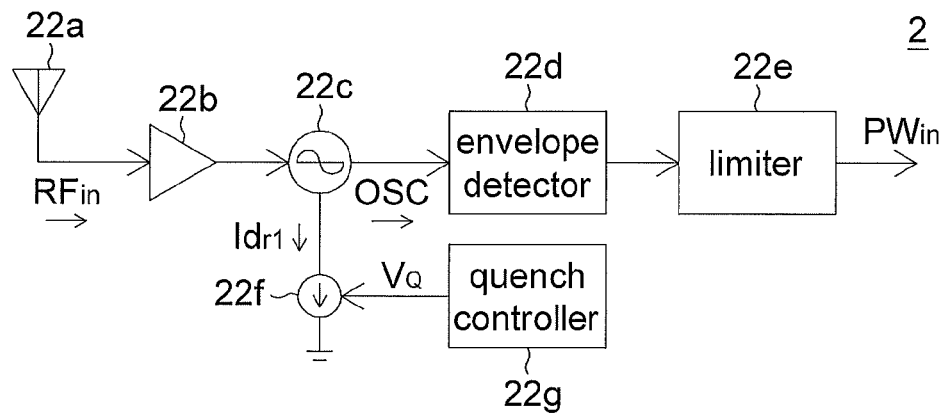
FIG. 8 is a detailed block diagram of the sensor 22 of FIG. 7.

Referring to FIG. 8, a detailed block diagram of the sensor 22 of FIG. 7 is shown. In the second embodiment, the PW signal $PW_{in}$ is left not modulated and an additional quench controller 22g is needed for providing the voltage signal $V_Q$ to driving the current source 22f. The voltage signal $V_Q$ corresponds to a fixed rising edge triggered at the boundary of the sub time periods $1^{st}$-$T_s$ and $2^{nd}$-$T_s$.

Figure 9:
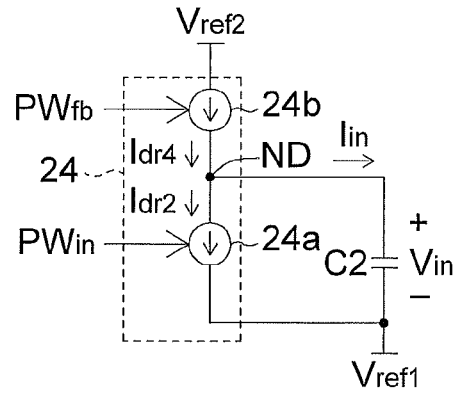
FIG. 9 is a detailed block diagram of the current pump 24 of FIG. 7.

Referring to FIG. 9, a detailed block diagram of the current pump 24 of FIG. 7 is shown. Instead of employing the current source 14b controlled by the reference PW signal $PW_{ref}$ as in the current pump 14 of the first embodiment, a current pump 24 with a current source 24b controlled by the feedback PW signal $PW_{fb}$ is employed in PW digitizer 2 of the second embodiment. The current source 24 is driven by the feedback PW signal $PW_{fb}$ to provide a driving current $I_{dr4}$, which corresponds to substantially the same current value as the driving current $I_{dr2}$ provided by the current source 24a. Thus, the current signal $I_{in}$, which is obtained as the difference between the driving currents $I_{dr2}$ and $I_{dr4}$ converges to a zero current value, just as the current signal $I_{in}$ modulated by the PW digitizer 1 of the first embodiment. Therefore, a negative feedback control loop similar to the one illustrated in the first embodiment, though with difference feedback circuit path, can be realized, so that a similar delta-sigma configuration can be obtained.

Though only the situation that the digitizer 20 has the circuit structure shown in FIG. 7 is cited as an example in the present embodiment, the digitizer 20 is not limited thereto and can be implemented with other circuit structures.

Though only the situation that the digitizer 20 is employed in the digitizer system 2 for carrying out PW-to-digital conversion on the PW signal $PW_{in}$ provided by the sensor 22 implemented with a super regenerative receiver is cited in the present embodiment, the digitizer 20 is not limited to thereto and can be applied to other applications employing PW-to-digital conversion.

Though only the situation that the digitizer 20 is employed in the digitizer system 2 for carrying out PW-to-digital conversion on the PW signal $PW_{in}$ provided by the sensor 22 implemented with a super regenerative receiver is cited in the present embodiment, the digitizer 20 is not limited to thereto and can be applied to other applications employing PW-to-digital conversion.

The PW digitizer system according to the present embodiment of the invention employs a converter for converting an input PW signal into a current signal and a quantizer for obtaining a digital signal in response to the current signal; a feedback loop for negatively feedback controlling the current signal converging to specific values and accordingly controlling the digital signal switching between a first code and a second code; and a digital filter for counting times that the digital signal indicating the first code and times that the digital signal indicating the second code, and accordingly obtaining the PW of the PW signal. Thus, the PW digitizer system according to the present embodiment of the invention can also carry out PW detection on the input PW signal by employing a delta-sigma configuration. Thus, in comparison to the conventional PW detection, the PW digitizer system directed by the invention is advantageously capable of detecting the PW with fine resolution with decent conversion speed and low quantization jitter.

Third Embodiment

Figure 10:
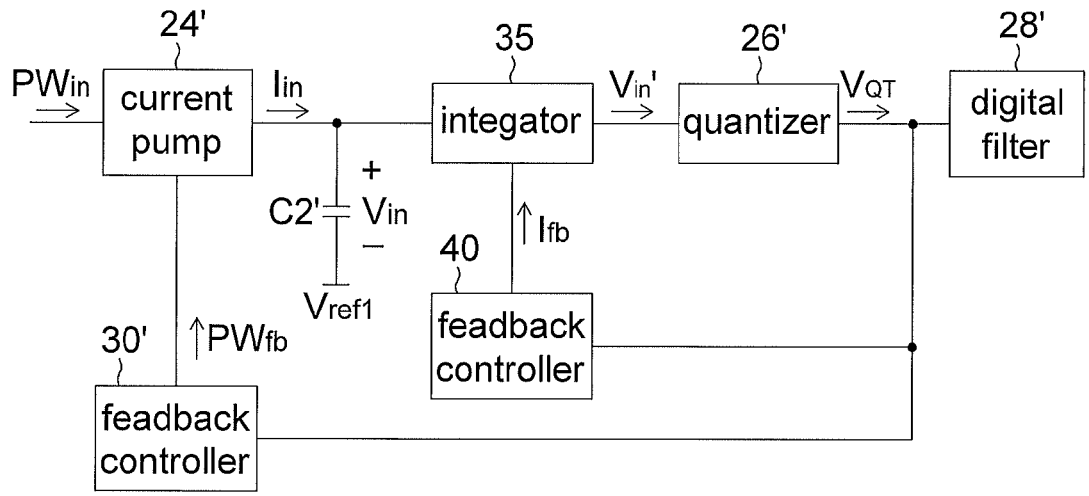
FIG. 10 is a detailed block diagram of a digitizer 20' according to a third embodiment.

A different circuit structure of the PW digitizer is disclosed in the present embodiment. Referring to FIG. 10, a block diagram of the pulse width digitizer according to a third embodiment of the invention is shown. The digitizer 20' is different from the digitizer disclosed in the previous embodiments in that an integrator 35 and another feedback controller 40 are further employed for second-order feedback control operation.

Figure 11:
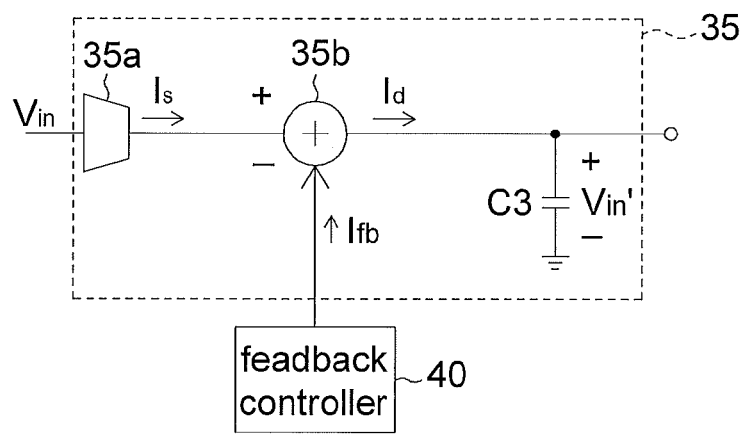
FIG. 11 is a detailed block diagram of the integrator 35 shown in FIG. 10.

The feedback controller 40 modulates the feedback current signal 6 in response to the digital signal $V_{QT}$. The feedback controller 40 feeds a feedback current signal 6 back to the integrator 35. The integrator 35, for example, includes a transconductor 35a, an adder 35b, and a capacitor C3, as shown in FIG. 11. The transconductor 35a obtains a current signal $I_s$ by means of transconductance conversion according to the voltage signal $V_{in}$. The adder 35b obtains a difference $I_d$ between the current signal $I_s$ and the feedback current signal $I_{fb}$. The capacitor C3 integrates the difference $I_d$ to obtain a filtered voltage signal $V'_{in}$. The filtered voltage signal $V'_{in}$ is provided to the quantizer 36 for accordingly obtaining the digital signal $V_{QT}$. Thus, the digitizer 20' is configured to have a $2^{nd}$ order high-pass filtering function (i.e. the integrator 35) of quantization noise shaping, rather than configured to have a first order high-pass filtering function as depicted in the previous embodiments.

The PW digitizer according to the present embodiment of the invention employs a converter for converting an input PW signal into a current signal and a quantizer for obtaining a digital signal in response to the current signal; a feedback loop for negatively feedback controlling the current signal converging to specific values and accordingly controlling the digital signal switching between a first code and a second code; and a digital filter for counting times that the digital signal indicating the first code and times that the digital signal indicating the second code, and accordingly obtaining the PW of the PW signal. Thus, the PW digitizer according to the present embodiment of the invention carries out PW detection on the input PW signal by employing a delta-sigma configuration. Thus, in comparison to the conventional PW detection, the PW digitizer directed by the invention is advantageously capable of detecting the PW with fine resolution with decent conversion speed and low quantization jitter.

While the invention has been described by ways of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A pulse width (PW) digitizer system, for determining a PW of a PW signal, the PW digitizer system comprising:
   a sensor, for providing the PW signal;
   a current pump, for providing a current signal in response to the PW signal;
   a first capacitor, for obtaining a voltage signal in response to the current signal;
   a quantizer, for obtaining a digital signal in response to the voltage signal;
   a first feedback controller, for determining a feedback PW signal in response to the digital signal, wherein the feedback PW signal is selectively fed back to one of the sensor and the current pump, for respectively controlling the PW signal converging to a specific PW and the current signal converging to a specific value and accordingly controlling the digital signal switching between a first code and a second code; and
   a digital filter, for counting times that the digital signal indicating the first code and times that the digital signal indicating the second code, and accordingly obtaining the PW of the PW signal.

2. The PW digitizer system according to claim 1, wherein the current pump comprises:
   a node, connected to the first capacitor; and
   a first current source, coupled to the node for selectively providing a first driving current flowing through the node and the first capacitor in response to the PW signal.

3. The PW digitizer system according to claim 2, wherein the current pump further comprises:
   a second current source, coupled to the node for selectively providing a second driving current in response to the feedback PW signal, the difference between the first and the second driving currents determining the current signal converging to the specific value.

4. The PW digitizer system according to claim 2, wherein the sensor comprises:
   an antenna, for receiving a radio frequency (RF) signal;
   an oscillator, driven by a second driving current, for generating the PW signal in response to the RF signal; and
   a second current source, for generating the second driving current in response to the feedback PW signal, wherein,
   an enabling time of the feedback PW signal and the second driving current are selectively set according to the digital signal, so that the operation of generating the PW signal in response to the RF signal can be selectively delayed to achieve PW subtraction operation on the PW signal and making the PW signal converging to the specific PW by means of negative feedback control.

5. The PW digitizer system according to claim 4, wherein the current pump further comprises:
   a third current source, coupled to the node for selectively providing a third driving current in response to a predetermined PW signal, the difference between the first and the third driving currents determining the current signal converging to the specific value.

6. The PW digitizer system according to claim 4, wherein the sensor is a super regenerative receiver.

7. The PW digitizer system according to claim 1, further comprising:
   a second feedback controller, for determining a feedback current signal in response to the digital signal; and
   an integrator, for processing the voltage signal fed into the quantizer, the integrator comprising:
      a transconductor, for generating a converted current signal according to the voltage signal;
      an adder, for obtaining a difference current between the converted signal and the feedback current signal; and
      a second capacitor, for obtaining a filtered voltage signal according to the difference current and providing the filtered voltage signal to the quantizer, which obtains the digital signal in response to the filtered voltage signal.

8. A pulse width (PW) digitizing method for determining a PW of a PW signal, the PW digitizing method comprising:
   receiving the PW signal at a sensor;
   determining a current signal according to the PW signal at a current pump;
   determining a voltage signal according to the current signal;
   determining a digital signal according to the voltage signal;
   determining a feedback PW signal in response to the digital signal, wherein the feedback PW signal is selectively fed back to one of the sensor and the current pump, for respectively controlling the PW signal converging to a specific PW and the current signal converging to a specific value and accordingly controlling the digital signal switching between a first code and a second code; and counting times that the digital signal indicating the first code and times that the digital signal indicating the second code, and accordingly obtaining the PW of the PW signal.

9. The PW digitizing method according to claim 8, wherein the step of determining the current signal further comprises:
generating a first driving current flowing through in response to the PW signal;
generating a second driving current in response to the feedback PW signal; and
determining the current signal, which converges to the specific value, as the difference between the first and the second driving currents.

10. The PW digitizing method according to claim 8 wherein the step of receiving the PW signal at a sensor further comprises:
generating the PW signal according to a radio frequency (RF) signal, wherein the operation of generating the PW signal is enabled by a first driving current; and
modulating the first driving current to selectively set an enabling time thereof according to the digital signal, so that the operation of generating the PW signal in response to the RF signal can be selectively delayed to achieve PW subtraction operation on the PW signal and making the PW signal converging to the specific PW by means of negative feedback control.

11. The PW digitizing method according to claim 10, wherein the step of determining the current signal further comprises:
generating a second driving current flowing through in response to the PW signal converging to the specific PW; and
generating a third driving current in response to a predetermined PW signal, the difference between the first and the third driving currents determining the current signal converging to the specific value.

12. The PW digitizing method according to claim 8, wherein the sensor is a super regenerative receiver.

13. A pulse width (PW) digitizer, for determining a PW of a PW signal, the PW digitizer comprising:
a current pump, for providing a current signal in response to the PW signal;
a first capacitor, for obtaining a voltage signal in response to the current signal;
a quantizer, for obtaining a digital signal in response to the voltage signal;
a feedback controller, for determining a feedback PW signal in response to the digital signal, wherein the feedback PW signal is fed back to the current pump for controlling the current signal converging to a specific value and accordingly controlling the digital signal switching between a first code and a second code; and
a digital filter, for counting times that the digital signal indicating the first code and times that the digital signal indicating the second code, and accordingly obtaining the PW of the PW signal.

14. The PW digitizer according to claim 13, wherein the current pump comprises:
a node, connected to the first capacitor; and
a first current source, coupled to the node for selectively providing a first driving current flowing through the node and the first capacitor in response to the PW signal.

15. The PW digitizer according to claim 14, wherein the current pump further comprises:
a second current source, coupled to the node for selectively providing a second driving current in response to the feedback PW signal, the difference between the first and the second driving currents determining the current signal converging to the specific value.

16. The PW digitizer according to claim 13, further comprising:
a second feedback controller, for determining a feedback current signal in response to the digital signal; and
an integrator, for processing the voltage signal fed into the quantizer, the integrator comprising:
a transconductor, for generating a converted current signal according to the voltage signal;
an adder, for obtaining a difference current between the converted signal and the feedback current signal; and
a second capacitor, for obtaining a filtered voltage signal according to the difference current and providing the filtered voltage signal to the quantizer, which obtains the digital signal in response to the filtered voltage signal.

* * * * *